(12) United States Patent
Kwon

(10) Patent No.: US 6,958,281 B2
(45) Date of Patent: Oct. 25, 2005

(54) METHOD FOR FORMING ALIGNMENT PATTERN OF SEMICONDUCTOR DEVICE

(75) Inventor: Won Taik Kwon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 114 days.

(21) Appl. No.: 10/748,463

(22) Filed: Dec. 30, 2003

(65) Prior Publication Data

US 2005/0118785 A1 Jun. 2, 2005

(30) Foreign Application Priority Data

Nov. 28, 2003 (KP) .................. 10-2003-0085801

(51) Int. Cl.[7] .......................................... H01L 21/76
(52) U.S. Cl. ................... 438/401; 438/427; 438/975
(58) Field of Search ........................... 438/401, 427, 438/524, 975

(56) References Cited

U.S. PATENT DOCUMENTS 6,020,249 A * 2/2000 Shih et al. ................ 438/401
6,037,236 A * 3/2000 Jang ........................ 438/401
6,136,662 A * 10/2000 Allman et al. ............ 438/427

* cited by examiner

Primary Examiner—Chandra Chaudhari
(74) Attorney, Agent, or Firm—Ladas & Parry LLP

(57) ABSTRACT

Disclosure is a method for forming an alignment pattern of a semiconductor device. The method has the steps of forming a trench in each of a cell area, a peripheral circuit area, and a scribe line of a silicon substrate, depositing an oxide layer on an entire surface of the silicon substrate in such a manner that the trench formed in the cell area of the silicon substrate is filled with the oxide layer, forming a trench-type isolation layer in both cell area and peripheral circuit area of the silicon substrate by CMP the oxide layer, forming an ion implantation mask for exposing predetermined portions of the cell area, the peripheral circuit area formed on the silicon substrate and a trench portion of the scribe line filled with the oxide layer, implanting impurities into an exposed portion of the silicon substrate, which is not covered with the ion implantation mask, performing the wet dipping for an oxide layer to a resultant structure of the silicon substrate so as to recess the oxide layer filled in the trench of the scribe line, and removing the ion implantation mask.

4 Claims, 6 Drawing Sheets

METHOD FOR FORMING ALIGNMENT PATTERN OF SEMICONDUCTOR DEVICE

BACKGROUND OF THE INVENTION

1. Field of the Invention

The present invention relates to a method for forming an alignment pattern of a semiconductor device, and more particularly to a method for forming an alignment pattern of a semiconductor device capable of simplifying an alignment pattern forming process.

2. Description of the Prior Art

As generally known in the art, a semiconductor device has a multi-layer structure including a plurality of layers. Accordingly, when fabricating the semiconductor device, overlay-accuracy is necessary between a predetermined pattern and other pattern formed below the predetermined pattern, or between the predetermined pattern and another pattern formed above the predetermined pattern.

Therefore, in a conventional process for fabricating a semiconductor device, an alignment pattern is provided so as to raise the overlay accuracy between a first pattern formed in a previous process and a second pattern formed in a present process.

Such an alignment pattern includes an align key and a vernier, in which the align key is used to align an exposure mask called a reticle to a precise position of an upper portion of a wafer and the verniers are used to detect and correct an overlay state between overlay patterns. Also, the alignment pattern is usually provided in a scribe line of the wafer used for dividing dies.

Furthermore, the alignment pattern is formed with a trench structure. An alignment signal is obtained from the alignment pattern having the trench structure due to a step difference between an upper surface of a substrate and a bottom surface of a trench. Also, the reticle is aligned based on the obtained alignment signal.

Currently, in order to achieve a high integration degree of the semiconductor device, an isolation process is performed with respect to the semiconductor device by using a STI (Shallow Trench Isolation) technique. However, while performing the isolation process, since a deposition process and a CMP (Chemical Mechanical Polishing) process are performed with respect to an oxide layer, the oxide layer is undesirably filled in the alignment pattern, that is, in the align key and various kinds of verniers provided in the scribe line. Accordingly, since the step difference of the alignment pattern is removed, the alignment signal is not obtained so that the reticle cannot be exactly aligned. As a result, an upper pattern cannot be exactly aligned with respect to a lower pattern.

Conventionally, a key open process is additionally performed in order to remove a predetermined portion of the oxide layer filled in the trench in such a manner that the alignment pattern has the step difference.

FIGS. 1A to 1E are sectional views representing each alignment forming process and explaining a method for forming an alignment pattern using a conventional key open process. Hereinafter, the conventional method will be described in detail with reference to FIGS. 1A to 1E.

Firstly, after forming a trench in a cell area, a peripheral circuit area, and a scribe line of a substrate 1 according to an STI (Shallow Trench Isolation) process, an initial alignment pattern 10 having a trench structure is provided in the scribe line as shown in FIG. 1A.

After that, an oxide layer 6 is deposited on an entire surface of the substrate 1 in such a manner that the trenches of the cell area and the peripheral circuit area are filled with the oxide layer 6. At this time, as shown in FIG. 1B, the oxide layer 6 is also deposited on the initial alignment pattern 10 having the trench structure. Accordingly, the initial alignment pattern 10 is undesirably filled with the oxide layer 6.

Subsequently, a trench-type isolation layer is formed in both cell area and peripheral circuit area by CMP the oxide layer 6. At this time, as shown in FIG. 1C, since the initial alignment pattern 10 is filled with the oxide layer 6, the initial alignment pattern 10 has no step difference. As a result, it is impossible to obtain the alignment signal from such an initial alignment pattern 10.

Accordingly, in order to obtain the alignment signal from the initial alignment pattern 10, a key open mask 8 exposing the initial alignment pattern 10 is formed on the substrate 1 through a photo process as shown in FIG. 1D, so as to remove a predetermined portion of the oxide layer filled in the initial alignment pattern. As a result, a final alignment pattern 10a having a step difference of a surface is formed as shown in FIG. 1E.

As described above, although the conventional method for forming the alignment pattern by using the key open process can reliably obtain the alignment signal, the key open process requires to form a key open mask through a photolithography process and to carry out an etching process by using the key open mask. Furthermore, it is required to perform a key open mask removal process and a cleaning process after the key open process has been carried out. For this reason, the conventional method for forming the alignment pattern using the key open process has problems in that not only is the process complicated, but a manufacturing cost and a manufacturing time of the semiconductor device increase.

SUMMARY OF THE INVENTION

Accordingly, the present invention has been made to solve the above-mentioned problems occurring in the prior art, and an object of the present invention is to provide a method for forming an alignment pattern of a semiconductor device capable of simplifying an alignment pattern forming process.

Another object of the present invention is to provide a method for forming an alignment pattern of a semiconductor device capable of reducing a manufacturing cost and a manufacturing time of the semiconductor device by simplifying an alignment pattern forming process.

In order to accomplish these objects, there is provided a method for forming an alignment pattern of a semiconductor device, the method comprising the steps of: forming a trench in each of a cell area, a peripheral circuit area, and a scribe line of a silicon substrate; depositing an oxide layer on an entire surface of the silicon substrate in such a manner that the trench formed in the cell area of the silicon substrate is filled with the oxide layer; forming a trench-type isolation layer in both cell area and peripheral circuit area of the silicon substrate by CMP the oxide layer; forming an ion implantation mask for exposing predetermined portions of the cell area, the peripheral circuit area formed on the silicon substrate and a trench portion of the scribe line filled with the oxide layer; implanting impurities into an exposed portion of the silicon substrate, which is not covered with the ion implantation mask; performing the wet dipping for an oxide layer to a resultant structure of the silicon substrate so as to recess the oxide layer filled in the trench of the scribe line; and removing the ion implantation mask.

According to an exemplary embodiment of the present invention, the ion implantation mask includes a well-forming ion implantation mask or a channel-forming ion implantation mask.

In addition, the wet dipping for oxide layer is performed in such a manner that a dip out target has thickness no greater than 300 Å.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
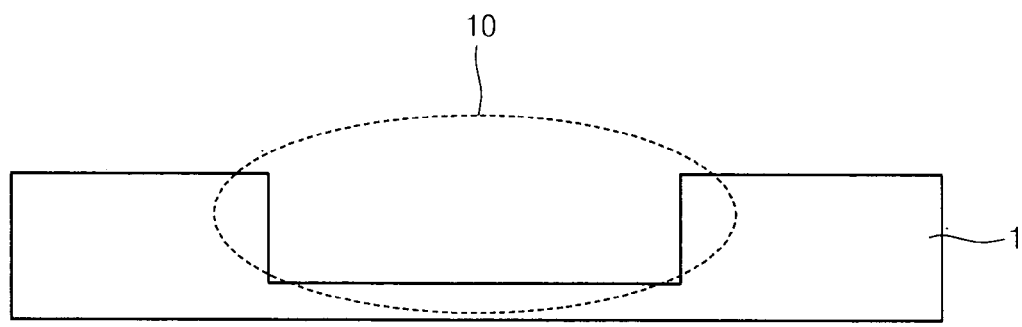
FIGS. 1A to 1E are sectional views representing each alignment pattern forming process and explaining a conventional method for forming an alignment pattern of a semiconductor device by using a key open process.
Figure 1B:
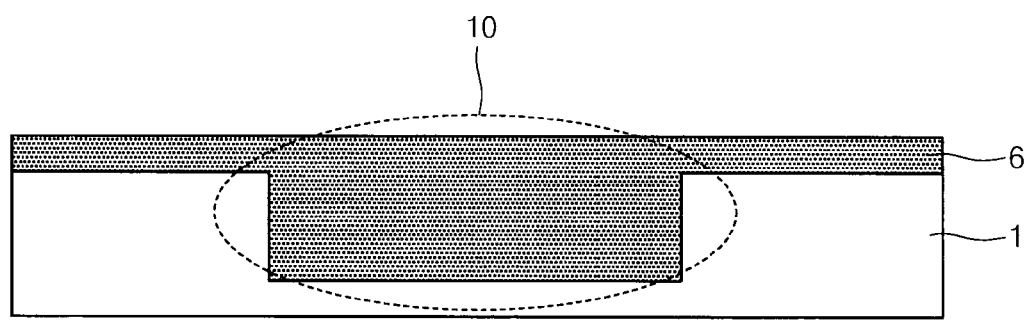
Figure 1C:
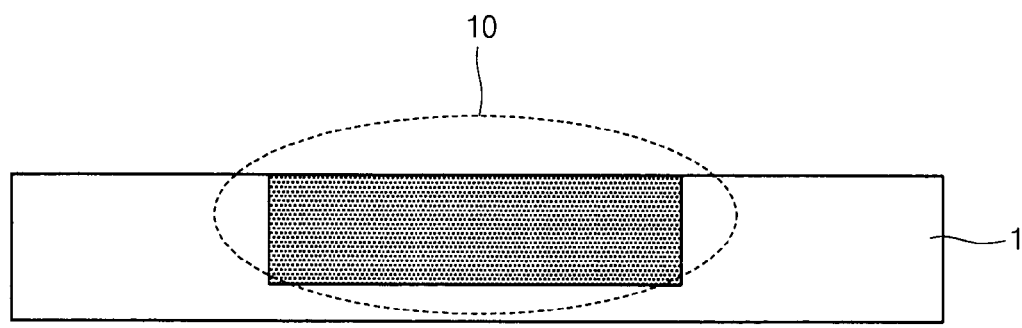
Figure 1D:
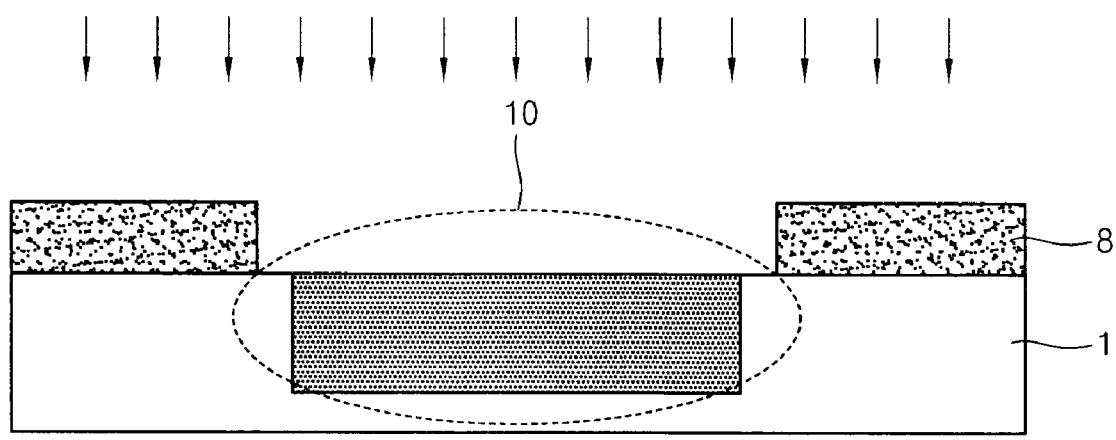
Figure 1E:
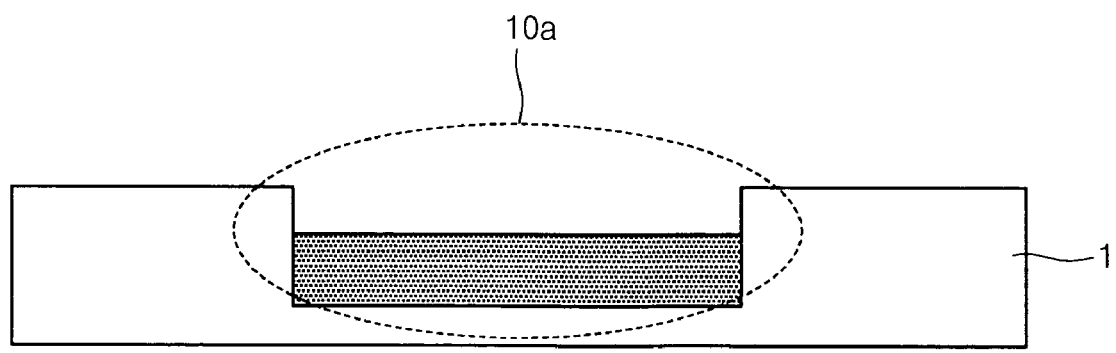

Hereinafter, a preferred embodiment of the present invention will be described with reference to the accompanying drawings. In the following description and drawings, the same reference numerals are used to designate the same or similar components, and so repetition of the description on the same or similar components will be omitted.

Firstly, a technical principle of the present invention will be described below.

According to the present invention, after implanting ions through an ion implantation process according to the well-known isolation process, a wet dipping for an oxide layer is performed before removing an ion implantation mask so as to recess the oxide layer filled in an alignment pattern having a shape of a trench, thereby forming a step coverage difference at the alignment pattern, that is, at an align key or a vernier.

At this time, according to the present invention, since it is unnecessary to perform an additional key open process for re-forming the step difference at the alignment pattern after the alignment pattern has been formed, it is possible to prevent the alignment pattern forming process from being complicated due to the additional key open process. In addition, a manufacturing cost and a manufacturing time resulting from the additional key open process can be decreased.

FIGS. 2A to 2E are sectional views representing each alignment pattern forming process and explaining a method for forming an alignment pattern of a semiconductor device according to one embodiment of the present invention. Hereinafter, the method will be described with reference to FIGS. 2A to 2E.

Figure 2A:
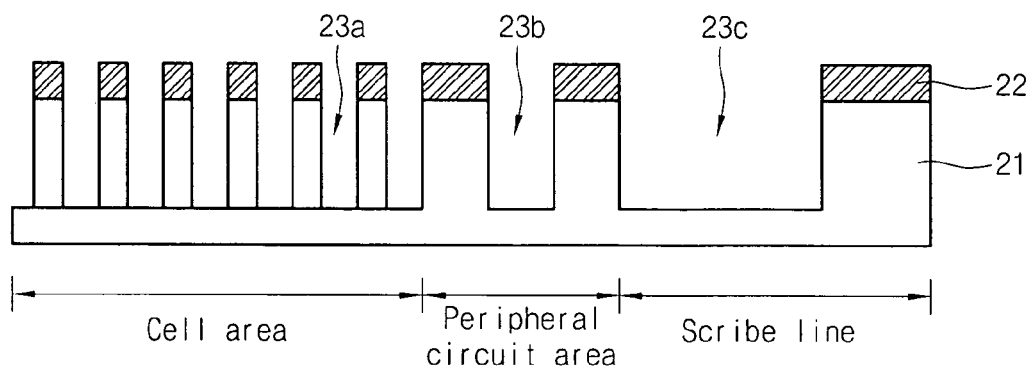
FIGS. 2A to 2E are sectional views representing each alignment pattern forming process and explaining a method for forming an alignment pattern of a semiconductor device according to one embodiment of the present invention.

Referring to FIG. 2A, a silicon substrate 21 divided into a cell area, a peripheral circuit area, and a scribe line is provided. Then, after forming an active mask 22 including a nitride layer on the silicon substrate 21 according to an well-known STI process, the silicon substrate 21 is etched by using the active mask 22 as an etching mask in such a manner that trenches 23a, 23b, and 23c are formed in the cell area, the peripheral circuit area, and the scribe line of the silicon substrate 21, respectively, thereby forming an initial alignment pattern 30 having the trench 23c in the scribe line.

Figure 2B:
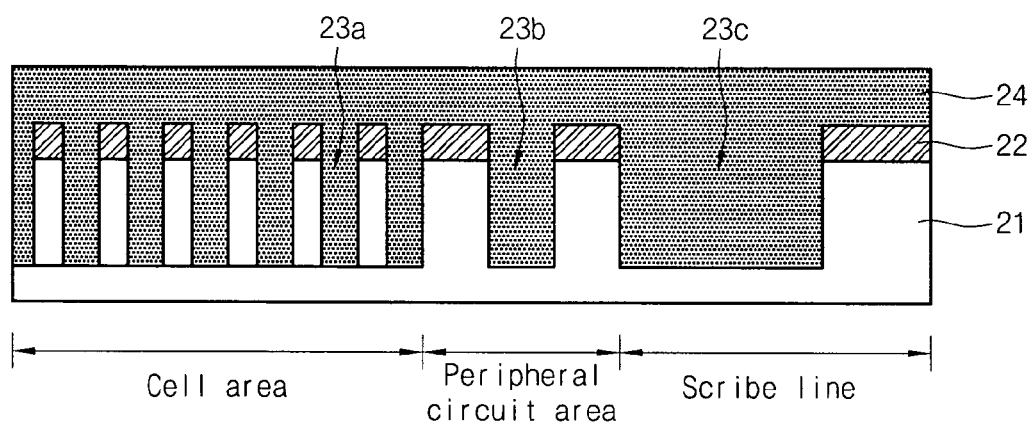

Referring to FIG. 2B, in order to insulate between cell transistors, an oxide layer 24 is deposited on an entire surface of the substrate 21. As a result, the trenches 23a and 23b of the cell area and the peripheral circuit area formed on the substrate 21 are filled with the oxide layer 24. Also, the initial alignment pattern 30 having a trench structure provided in the scribe line is filled with the oxide layer 24.

Figure 2C:
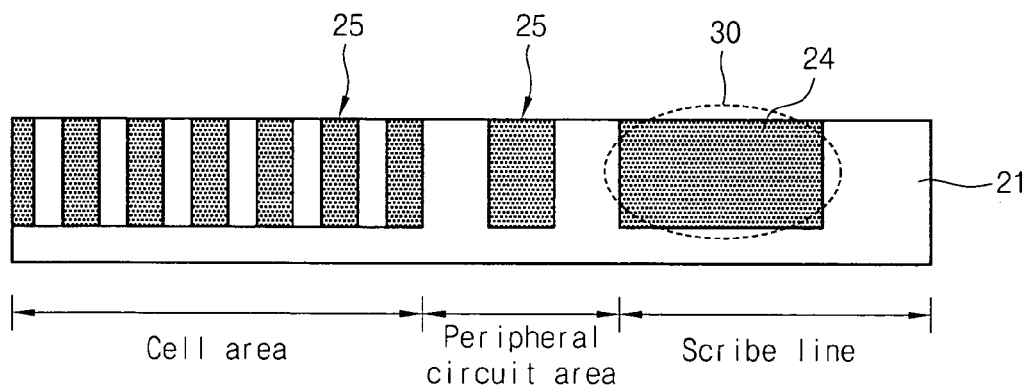

Referring to FIG. 2C, a CMP process is performed to the oxide layer 24, thereby forming trench-type isolation layers 25 in both cell area and peripheral circuit area of the substrate 21. Thereafter, the active mask including a nitride layer is removed. As a result, the initial alignment pattern 30 having the trench structure is undesirably filled with the oxide layer 24, so the step coverage difference of the initial alignment pattern 30 is removed. Accordingly, when reading an alignment signal for detecting an overlay state of patterns and a reticle alignment by using such an initial alignment pattern 30 in a next photo-process, a reading error occurs.

Accordingly, it is necessary to re-form the step coverage difference which has been removed in the initial alignment pattern 30. To this end, the present invention performs the following process.

Figure 2D:
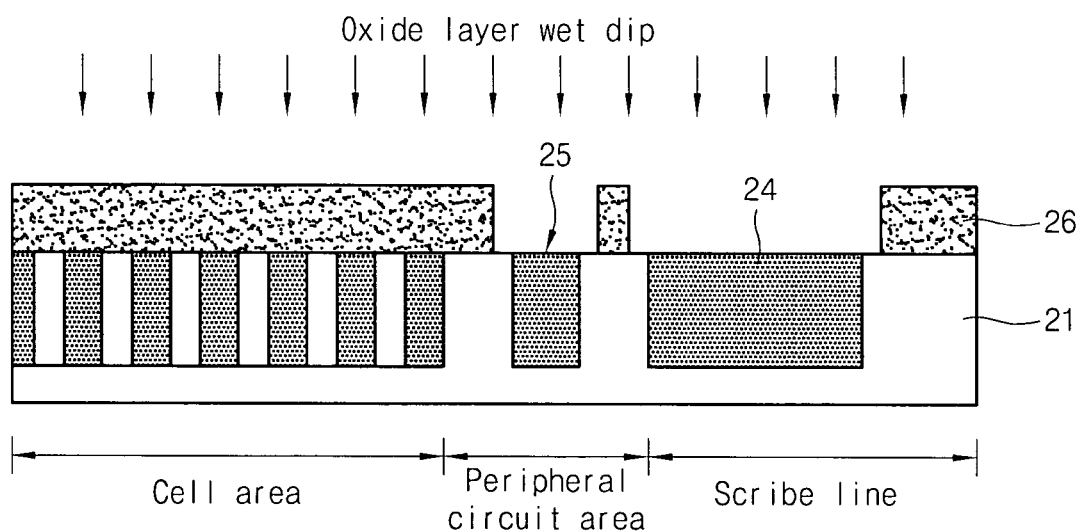

Referring to FIG. 2D, an ion implantation process including about 5 to 7 steps is performed so as to form a well and a channel. At this time, when performing any one step of the ion implantation process, an ion implantation mask 26 for forming the well or the channel is formed in such a manner that not only predetermined portions of the cell area and the peripheral circuit area, such as a P-well forming area, an N-well forming area, a P-channel forming area, or an N-channel forming area, but also the initial alignment pattern 30 of the scribe line are exposed. After that, impurities for forming the well and the channel are implanted into the exposed portion of the substrate, which is not covered with the ion implantation mask 26.

Thereafter, the wet dipping for oxide layer is performed to a resultant structure of the substrate, in which ions are implanted, before removing the ion implantation mask 26. As a result, the oxide layer 24, which is filled in the initial alignment pattern 30 having the trench structure of the scribe line, is recessed. At this time, the wet dipping for oxide layer is performed in such a manner that a dip out target has thickness no greater than 300 Å, so as to prevent the peripheral circuit area from being damaged. That is, the wet dipping for oxide layer is performed by dipping the resultant structure of the substrate in a solution of NH4F+HF (20:1) for 5~10 seconds.

Figure 2E:
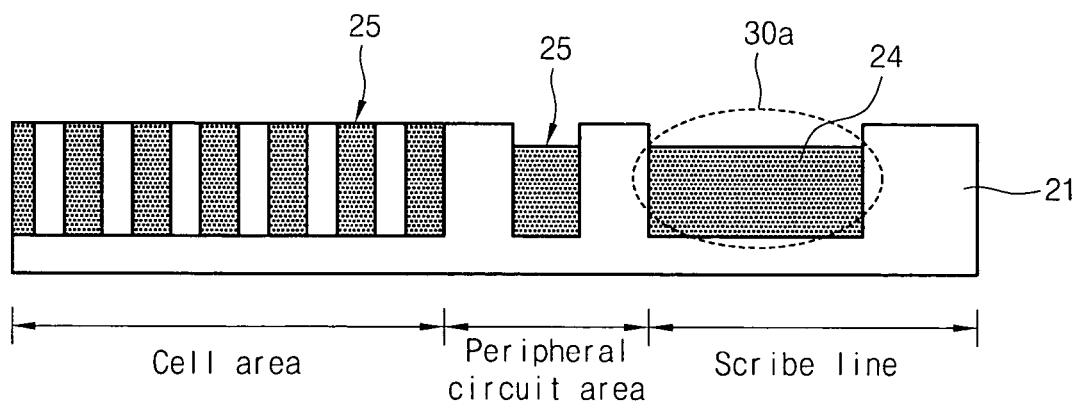

Referring to FIG. 2E, the ion implantation mask is removed through an well-known PR-strip process, so that a final alignment pattern 30a having a step coverage difference is formed.

According to the present invention, since the wet dipping for oxide layer, which is carried out next to the ion implantation process, is performed so as to form the step coverage difference removed by the oxide layer filled in the alignment pattern having the trench structure, it is unnecessary to perform the additional key open process. Therefore, the present invention can remarkably simplify a process for forming the alignment pattern as compared with a conventional alignment pattern forming process, so that a manufacturing cost and a manufacturing time can be reduced.

Figure 3:
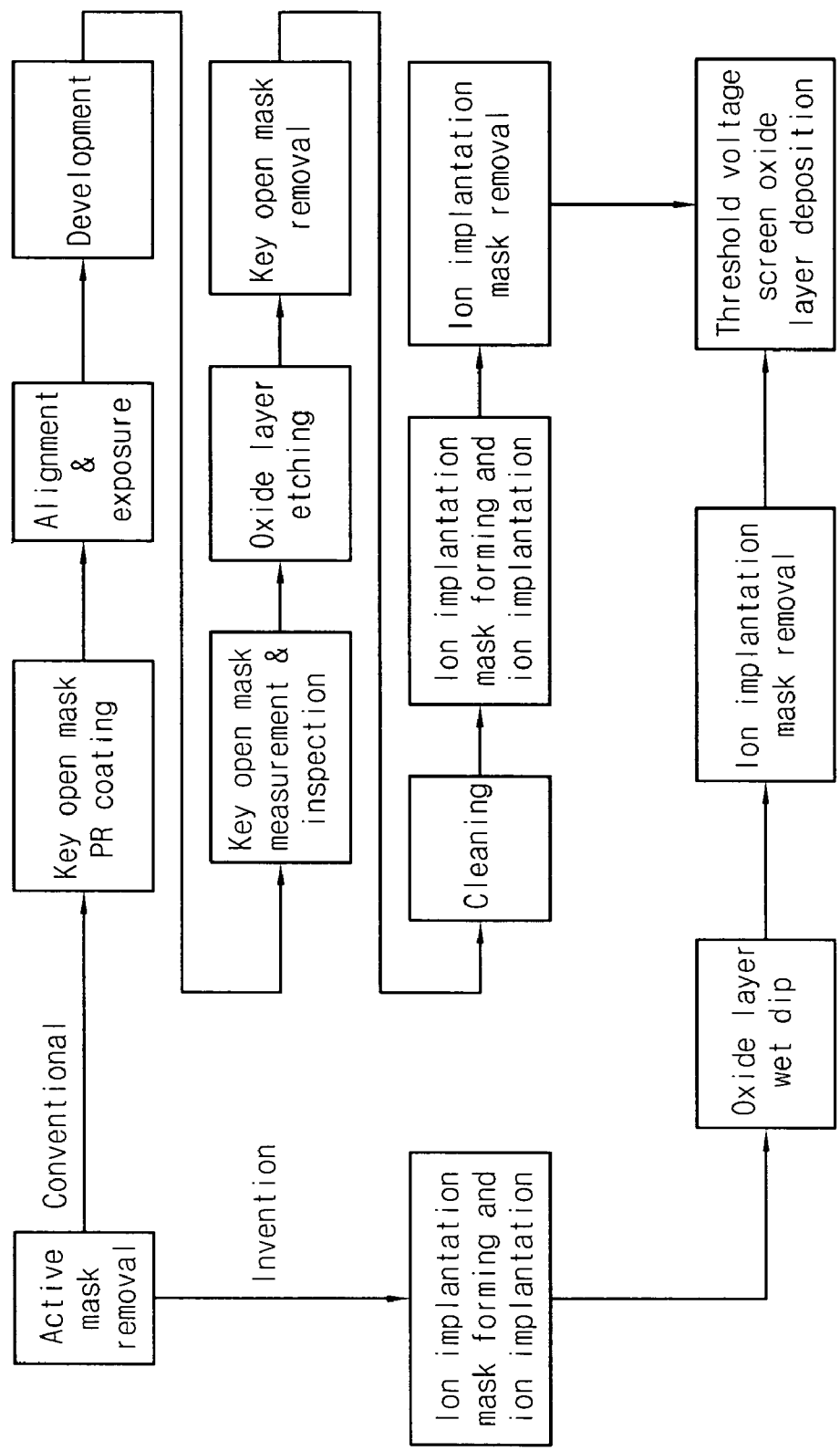
FIG. 3 is a block diagram showing processes for forming an alignment pattern according to the present invention and the prior art.

FIG. 3 is a block diagram showing processes for forming an alignment pattern according to the present invention and the prior art.

As shown in FIG. 3, according to the conventional process for forming the alignment pattern, after an active mask removal process has been performed in the STI process, it is required to perform 9 steps including a key open mask PR coating process, an alignment and exposure process, a development process, a key open mask measurement and inspection process, an oxide layer etching process, a key open mask removal process, a cleaning process, an ion implantation mask forming and ion implantation process, and an ion implantation mask removal process, before a threshold voltage screen mask oxide layer deposition process is carried out. In contrast, according to the present invention, it is required to perform 3 steps including a process forming an ion implantation mask, ion implantation process, the wet dipping process for an oxide layer, and an ion implantation mask removal process, before the threshold voltage screen mask oxide layer deposition process is carried out after the active mask removal process has been carried out in the STI process.

As a result, according to the present invention, the conventional 9 steps for re-forming the step difference at the alignment pattern can be reduced to 3 steps by performing the additional wet dipping process for oxide layer after the ion implantation process has been carried out and before the ion implantation mask removal process is carried out. For this reason, it is possible to simplify the process for forming the alignment pattern and to reduce a manufacturing cost and a manufacturing time.

Figure 4:
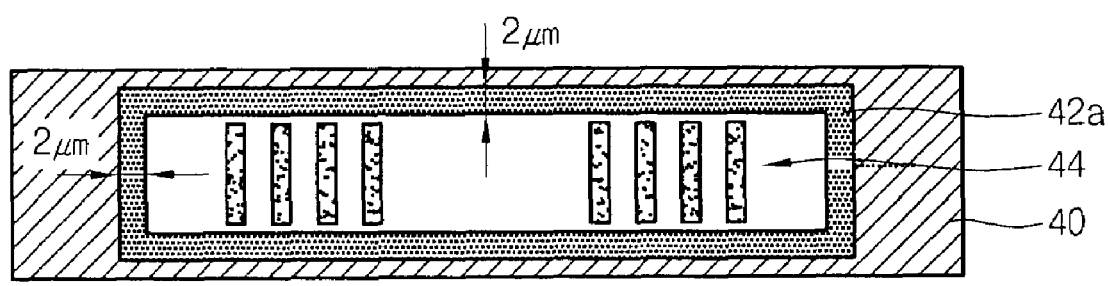
FIG. 4 is a view for showing a reticle for forming an ion implantation mask according to one embodiment of the present invention.
Figure 4:
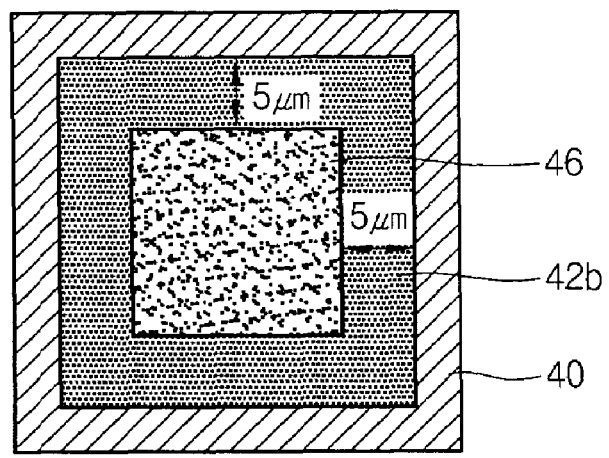

Furthermore, as shown in FIG. 4, the ion implantation mask exposing the initial alignment pattern can be easily obtained by forming window patterns 40a and 40b on a reticle 40 corresponding to a scribe line when additional forming the ion implantation mask.

At this time, as shown in an upper portion of FIG. 4, the window pattern 42a corresponding to an alignment key 44 is formed in such a manner that the window pattern 42a is spaced from the alignment key 44 formed on the active mask of the reticle 40 by a distance of about 1.5~2.5 µm, preferably, about 2 µm. Also, as shown in a lower portion of FIG. 4, the window pattern 42b corresponding to a vernier is formed in such a manner that the window pattern 42b is spaced from the vernier formed on the active mask by a distance of about 4.5~5.5 µm, preferably, about 5 µm.

As described above, according to the present invention, after implanting ions through the ion implantation process next to the isolation process, the oxide layer wet dip process is additionally performed so as to recess the oxide layer at the alignment pattern. Accordingly, it is possible to re-form the step difference at the alignment pattern without performing the key open process.

Accordingly, the present invention can omit the additional key open process, thereby simplifying the process for forming the alignment pattern. In particular, since the process for forming the alignment pattern is simplified, it is possible to reduce a manufacturing cost and a manufacturing time.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an alignment pattern of a semiconductor device, the method comprising the steps of:
   i) forming a trench in each of a cell area, the peripheral circuit area, and the scribe line, a peripheral circuit area, and a scribe line of a silicon substrate;
   ii) depositing an oxide layer on an entire surface of the silicon substrate in such a manner that the trench formed in the cell area of the silicon substrate is filled with the oxide layer;
   iii) forming a trench isolation layer in the cell area and peripheral circuit area and scribe line of the silicon substrate by CMP with respect to the oxide layer;
   iv) forming an ion implantation mask for exposing predetermined portions of the cell area, the peripheral circuit area formed on the silicon substrate and a trench portion of the scribe line filled with the oxide layer;
   v) implanting impurities into an exposed portion of the silicon substrate, which is not covered with the ion implantation mask;
   vi) performing wet dipping for the oxide layer to a resultant structure of the silicon substrate so as to recess the oxide layer filled in the trench of the scribe line; and
   vii) removing the ion implantation mask.

2. The method as claimed in claim 1, wherein the ion implantation mask includes a well-forming ion implantation mask or a channel-forming ion implantation mask.

3. The method as claimed in claim 1, wherein the wet dipping for the oxide layer is performed in such a manner that a dip out target has thickness no greater than 300 Å.

4. The method as claimed in claim 1, wherein the wet dipping for the oxide layer is performed by dipping in a solution of NH4F+HF (20:1) for 5~10 seconds.

* * * * *

UNITED STATES PATENT AND TRADEMARK OFFICE
CERTIFICATE OF CORRECTION

PATENT NO. : 6,958,281 B2  Page 1 of 1
DATED : October 25, 2005
INVENTOR(S) : Won Taik Kwon It is certified that error appears in the above-identified patent and that said Letters Patent is hereby corrected as shown below:

<u>Title page,</u>
Item [30], Foreign Application Priority Data, delete "(KP)" and insert -- (KR) --.

Signed and Sealed this

Fourth Day of April, 2006

JON W. DUDAS
*Director of the United States Patent and Trademark Office*